(12) United States Patent
Maeda

(10) Patent No.: US 6,738,947 B1
(45) Date of Patent: May 18, 2004

(54) METHOD AND APPARATUS FOR ERROR CORRECTION

(75) Inventor: Toshinori Maeda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 521 days.

(21) Appl. No.: 09/694,816

(22) Filed: Oct. 24, 2000

(30) Foreign Application Priority Data

Oct. 25, 1999 (JP) .......................................... 11-302622

(51) Int. Cl.[7] ............................................. H03M 13/00
(52) U.S. Cl. ...................................................... 714/785
(58) Field of Search ........................................ 714/785

(56) References Cited

U.S. PATENT DOCUMENTS

| | | | |
|---|---|---|---|
| 5,384,786 A | | 1/1995 | Dudley et al. |
| 5,490,260 A | * | 2/1996 | Miller et al. ................. 711/100 |
| 5,577,054 A | * | 11/1996 | Pharris ........................ 714/762 |
| 5,642,366 A | * | 6/1997 | Lee et al. ..................... 714/762 |
| 5,818,854 A | | 10/1998 | Meyer |
| 5,912,905 A | | 6/1999 | Sakai et al. |

FOREIGN PATENT DOCUMENTS

| | | |
|---|---|---|
| JP | 5-12814 | 1/1993 |
| JP | 10-107648 | 4/1998 |

OTHER PUBLICATIONS

IBM Technical Disclosure Bulletin NN7409974, Error Correction Apparatus, Sep. 1974.*

* cited by examiner

Primary Examiner—Albert Decady
Assistant Examiner—Joseph D. Torres
(74) Attorney, Agent, or Firm—Wenderoth, Lind & Ponack, L.L.P.

(57) ABSTRACT

The present invention provides an apparatus and method for error correction that can directly performs the operation without deinterleaving read data, that has an increased parallel operation and performs at high-speed. An error correction apparatus 50 comprises a plurality of syndrome operation circuits 21 based on a parallel operation, and a second Galois field multiplication circuit 25 for multiplying a syndrome operation result halfway through the operation by index compensating coefficients.

7 Claims, 7 Drawing Sheets

| | 22 | 23 | 24 | 25 | 26 | 27 | 28 | 29 | 30 | 31 | 32 | 33 | 34 | 35 | 36 | 37 | 38 | 39 | 40 | 41 | 42 | 01 | 02 |
|---|---|---|---|---|---|---|---|---|---|---|---|---|---|---|---|---|---|---|---|---|---|---|---|
| 0 | 22 | 23 | 24 | 25 | 26 | 27 | 28 | 29 | 30 | 31 | 32 | 33 | 34 | 35 | 36 | 37 | 38 | 39 | 40 | 41 | 42 | 1127 | 1152 |
| 1 | 65 | 66 | 67 | 68 | 69 | 70 | 71 | 72 | 73 | 74 | 75 | 76 | 77 | 78 | 79 | 80 | 81 | 82 | 83 | 84 | 85 | 1128 | 1153 |
| 2 | 108 | 109 | 110 | 111 | 112 | 113 | 114 | 115 | 116 | 117 | 118 | 119 | 120 | 121 | 122 | 123 | 124 | 125 | 126 | 127 | 128 | 1129 | 1154 |
| 3 | 151 | 152 | 153 | 154 | 155 | 156 | 157 | 158 | 159 | 160 | 161 | 162 | 163 | 164 | 165 | 166 | 167 | 168 | 169 | 170 | 171 | 1130 | 1155 |
| 4 | 194 | 195 | 196 | 197 | 198 | 199 | 200 | 201 | 202 | 203 | 204 | 205 | 206 | 207 | 208 | 209 | 210 | 211 | 212 | 213 | 214 | 1131 | 1156 |
| 5 | 237 | 238 | 239 | 240 | 241 | 242 | 243 | 244 | 245 | 246 | 247 | 248 | 249 | 250 | 251 | 252 | 253 | 254 | 255 | 256 | 257 | 1132 | 1157 |
| 6 | 280 | 281 | 282 | 283 | 284 | 285 | 286 | 287 | 288 | 289 | 290 | 291 | 292 | 293 | 294 | 295 | 296 | 297 | 298 | 299 | 300 | 1133 | 1158 |
| 7 | 323 | 324 | 325 | 326 | 327 | 328 | 329 | 330 | 331 | 332 | 333 | 334 | 335 | 336 | 337 | 338 | 339 | 340 | 341 | 342 | 343 | 1134 | 1159 |
| 8 | 366 | 367 | 368 | 369 | 370 | 371 | 372 | 373 | 374 | 375 | 376 | 377 | 378 | 379 | 380 | 381 | 382 | 383 | 384 | 385 | 386 | 1135 | 1160 |
| 9 | 409 | 410 | 411 | 412 | 413 | 414 | 415 | 416 | 417 | 418 | 419 | 420 | 421 | 422 | 423 | 424 | 425 | 426 | 427 | 428 | 429 | 1136 | 1161 |
| 10 | 452 | 453 | 454 | 455 | 456 | 457 | 458 | 459 | 460 | 461 | 462 | 463 | 464 | 465 | 466 | 467 | 468 | 469 | 470 | 471 | 472 | 1137 | 1162 |
| 11 | 495 | 496 | 497 | 498 | 499 | 500 | 501 | 502 | 503 | 504 | 505 | 506 | 507 | 508 | 509 | 510 | 511 | 512 | 513 | 514 | 515 | 1138 | 1163 |
| 12 | 538 | 539 | 540 | 541 | 542 | 543 | 544 | 545 | 546 | 547 | 548 | 549 | 550 | 551 | 552 | 553 | 554 | 555 | 556 | 557 | 558 | 1139 | 1164 |
| 13 | 581 | 582 | 583 | 584 | 585 | 586 | 587 | 588 | 589 | 590 | 591 | 592 | 593 | 594 | 595 | 596 | 597 | 598 | 599 | 600 | 601 | 1140 | 1165 |
| 14 | 624 | 625 | 626 | 627 | 628 | 629 | 630 | 631 | 632 | 633 | 634 | 635 | 636 | 637 | 638 | 639 | 640 | 641 | 642 | 643 | 644 | 1141 | 1166 |
| 15 | 667 | 668 | 669 | 670 | 671 | 672 | 673 | 674 | 675 | 676 | 677 | 678 | 679 | 680 | 681 | 682 | 683 | 684 | 685 | 686 | 687 | 1142 | 1167 |
| 16 | 710 | 711 | 712 | 713 | 714 | 715 | 716 | 717 | 718 | 719 | 720 | 721 | 722 | 723 | 724 | 725 | 726 | 727 | 728 | 729 | 730 | 1143 | 1168 |
| 17 | 753 | 754 | 755 | 756 | 757 | 758 | 759 | 760 | 761 | 762 | 763 | 764 | 765 | 766 | 767 | 768 | 769 | 770 | 771 | 772 | 773 | 1118 | 1169 |
| 18 | 796 | 797 | 798 | 799 | 800 | 801 | 802 | 803 | 804 | 805 | 806 | 807 | 808 | 809 | 810 | 811 | 812 | 813 | 814 | 815 | 816 | 1119 | 1144 |
| 19 | 839 | 840 | 841 | 842 | 843 | 844 | 845 | 846 | 847 | 848 | 849 | 850 | 851 | 852 | 853 | 854 | 855 | 856 | 857 | 858 | 859 | 1120 | 1145 |
| 20 | 882 | 883 | 884 | 885 | 886 | 887 | 888 | 889 | 890 | 891 | 892 | 893 | 894 | 895 | 896 | 897 | 898 | 899 | 900 | 901 | 902 | 1121 | 1146 |
| 21 | 925 | 926 | 927 | 928 | 929 | 930 | 931 | 932 | 933 | 934 | 935 | 936 | 937 | 938 | 939 | 940 | 941 | 942 | 943 | 944 | 945 | 1122 | 1147 |
| 22 | 968 | 969 | 970 | 971 | 972 | 973 | 974 | 975 | 976 | 977 | 978 | 979 | 980 | 981 | 982 | 983 | 984 | 985 | 986 | 987 | 988 | 1123 | 1148 |
| 23 | 1011 | 1012 | 1013 | 1014 | 1015 | 1016 | 1017 | 1018 | 1019 | 1020 | 1021 | 1022 | 1023 | 1024 | 1025 | 1026 | 1027 | 1028 | 1029 | 1030 | 1031 | 1124 | 1149 |
| 24 | 1054 | 1055 | 1056 | 1057 | 1058 | 1059 | 1060 | 1061 | 1062 | 1063 | 1064 | 1065 | 1066 | 1067 | 1068 | 1069 | 1070 | 1071 | 1072 | 1073 | 1074 | 1125 | 1150 |
| 25 | 1097 | 1098 | 1099 | 1100 | 1101 | 1102 | 1103 | 1104 | 1105 | 1106 | 1107 | 1108 | 1109 | 1110 | 1111 | 1112 | 1113 | 1114 | 1115 | 1116 | 1117 | 1126 | 1151 |

Fig.4

|   | Audio L-CH | | Audio R-CH | |
|---|---|---|---|---|
|   | L | M | L | M |
| 1 | 00000000 | 11111111 | 00000000 | 11111111 |
| 2 | 00000000 | 11111111 | 00000000 | 11111111 |
| 3 | 00000000 | 11111111 | 00000000 | 11111111 |
| 4 | 0000L | 0000M | 0001L | 0001M |
| 5 | 0002L | 0002M | 0003L | 0003M |
| 6 | 0004L | 0004M | 0005L | 0005M |
| 7 | 0006L | 0006M | 0007L | 0007M |
| ⋮ | ⋮ | ⋮ | ⋮ | ⋮ |
| 587 | 1166L | 1166M | 1167L | 1167M |
| 588 | 1168L | 1168M | 1169L | 1169M |

Rows 1–3 are group 1; rows 4–588 are group 2; element 0001L is marked as 3.

Fig.5

|    | 0     | 1     | 2     | ... | 40    | 41    | 42    |
|----|-------|-------|-------|-----|-------|-------|-------|
| 0  | 0000L | 0001L | 0002L | ... | 0040L | 0041L | 0042L |
| 1  | 0043L | 0044L | 0045L | ... | 0083L | 0084L | 0085L |
| 2  | 0086L | 0087L | 0088L | ... | 0126L | 0127L | 0128L |
| 3  | 0129L | 0130L | 0131L | ... | 0169L | 0170L | 0171L |
| 4  |       |       |       |     |       |       |       |
| .  |       |       |       |     |       |       |       |
| .  |       |       |       |     |       |       |       |
| .  |       |       |       |     |       |       |       |
| 23 | 0946L | 0947L | 0948L | ... | 0986L | 0987L | 0988L |
| 24 | 0989L | 0990L | 0991L | ... | 1029L | 1030L | 1031L |
| 25 | 1032L | 1033L | 1034L | ... | 1072L | 1073L | 1074L |
| 26 | 1075L | 1076L | 1077L | ... | 1115L | 1116L | 1117L |
| 27 | 1118L | 1145L | 1146L | ... | 1143L | 1169L |       |

Fig.6

| i \ j | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| 0 | 0 | 44 | 88 | 132 | 176 | 220 | 264 | 308 | 352 | 396 | 440 | 484 | 528 | 572 | 616 | 660 | 704 | 748 | 792 | 836 | 880 | 924 | 968 |
| 1 | 43 | 87 | 131 | 175 | 219 | 263 | 307 | 351 | 395 | 439 | 483 | 527 | 571 | 615 | 659 | 703 | 747 | 791 | 835 | 879 | 923 | 967 | 1011 |
| 2 | 86 | 130 | 174 | 218 | 262 | 306 | 350 | 394 | 438 | 482 | 526 | 570 | 614 | 658 | 702 | 746 | 790 | 834 | 878 | 922 | 966 | 1010 | 1054 |
| 3 | 129 | 173 | 217 | 261 | 305 | 349 | 393 | 437 | 481 | 525 | 569 | 613 | 657 | 701 | 745 | 789 | 833 | 877 | 921 | 965 | 1009 | 1053 | 1097 |
| 4 | 172 | 216 | 260 | 304 | 348 | 392 | 436 | 480 | 524 | 568 | 612 | 656 | 700 | 744 | 788 | 832 | 876 | 920 | 964 | 1008 | 1052 | 1096 | 22 |
| 5 | 215 | 259 | 303 | 347 | 391 | 435 | 479 | 523 | 567 | 611 | 655 | 699 | 743 | 787 | 831 | 875 | 919 | 963 | 1007 | 1051 | 1095 | 21 | 65 |
| 6 | 258 | 302 | 346 | 390 | 434 | 478 | 522 | 566 | 610 | 654 | 698 | 742 | 786 | 830 | 874 | 918 | 962 | 1006 | 1050 | 1094 | 20 | 64 | 108 |
| 7 | 301 | 345 | 389 | 433 | 477 | 521 | 565 | 609 | 653 | 697 | 741 | 785 | 829 | 873 | 917 | 961 | 1005 | 1049 | 1093 | 19 | 63 | 107 | 151 |
| 8 | 344 | 388 | 432 | 476 | 520 | 564 | 608 | 652 | 696 | 740 | 784 | 828 | 872 | 916 | 960 | 1004 | 1048 | 1092 | 18 | 62 | 106 | 150 | 194 |
| 9 | 387 | 431 | 475 | 519 | 563 | 607 | 651 | 695 | 739 | 783 | 827 | 871 | 915 | 959 | 1003 | 1047 | 1091 | 17 | 61 | 105 | 149 | 193 | 237 |
| 10 | 430 | 474 | 518 | 562 | 606 | 650 | 694 | 738 | 782 | 826 | 870 | 914 | 958 | 1002 | 1046 | 1090 | 16 | 60 | 104 | 148 | 192 | 236 | 280 |
| 11 | 473 | 517 | 561 | 605 | 649 | 693 | 737 | 781 | 825 | 869 | 913 | 957 | 1001 | 1045 | 1089 | 15 | 59 | 103 | 147 | 191 | 235 | 279 | 323 |
| 12 | 516 | 560 | 604 | 648 | 692 | 736 | 780 | 824 | 868 | 912 | 956 | 1000 | 1044 | 1088 | 14 | 58 | 102 | 146 | 190 | 234 | 278 | 322 | 366 |
| 13 | 559 | 603 | 647 | 691 | 735 | 779 | 823 | 867 | 911 | 955 | 999 | 1043 | 1087 | 13 | 57 | 101 | 145 | 189 | 233 | 277 | 321 | 365 | 409 |
| 14 | 602 | 646 | 690 | 734 | 778 | 822 | 866 | 910 | 954 | 998 | 1042 | 1086 | 12 | 56 | 100 | 144 | 188 | 232 | 276 | 320 | 364 | 408 | 452 |
| 15 | 645 | 689 | 733 | 777 | 821 | 865 | 909 | 953 | 997 | 1041 | 1085 | 11 | 55 | 99 | 143 | 187 | 231 | 275 | 319 | 363 | 407 | 451 | 495 |
| 16 | 688 | 732 | 776 | 820 | 864 | 908 | 952 | 996 | 1040 | 1084 | 10 | 54 | 98 | 142 | 186 | 230 | 274 | 318 | 362 | 406 | 450 | 494 | 538 |
| 17 | 731 | 775 | 819 | 863 | 907 | 951 | 995 | 1039 | 1083 | 9 | 53 | 97 | 141 | 185 | 229 | 273 | 317 | 361 | 405 | 449 | 493 | 537 | 581 |
| 18 | 774 | 818 | 862 | 906 | 950 | 994 | 1038 | 1082 | 8 | 52 | 96 | 140 | 184 | 228 | 272 | 316 | 360 | 404 | 448 | 492 | 536 | 580 | 624 |
| 19 | 817 | 861 | 905 | 949 | 993 | 1037 | 1081 | 7 | 51 | 95 | 139 | 183 | 227 | 271 | 315 | 359 | 403 | 447 | 491 | 535 | 579 | 623 | 667 |
| 20 | 860 | 904 | 948 | 992 | 1036 | 1080 | 6 | 50 | 94 | 138 | 182 | 226 | 270 | 314 | 358 | 402 | 446 | 490 | 534 | 578 | 622 | 666 | 710 |
| 21 | 903 | 947 | 991 | 1035 | 1079 | 5 | 49 | 93 | 137 | 181 | 225 | 269 | 313 | 357 | 401 | 445 | 489 | 533 | 577 | 621 | 665 | 709 | 753 |
| 22 | 946 | 990 | 1034 | 1078 | 4 | 48 | 92 | 136 | 180 | 224 | 268 | 312 | 356 | 400 | 444 | 488 | 532 | 576 | 620 | 664 | 708 | 752 | 796 |
| 23 | 989 | 1033 | 1077 | 3 | 47 | 91 | 135 | 179 | 223 | 267 | 311 | 355 | 399 | 443 | 487 | 531 | 575 | 619 | 663 | 707 | 751 | 795 | 839 |
| 24 | 1032 | 1076 | 2 | 46 | 90 | 134 | 178 | 222 | 266 | 310 | 354 | 398 | 442 | 486 | 530 | 574 | 618 | 662 | 706 | 750 | 794 | 838 | 882 |
| 25 | 1075 | 1 | 45 | 89 | 133 | 177 | 221 | 265 | 309 | 353 | 397 | 441 | 485 | 529 | 573 | 617 | 661 | 705 | 749 | 793 | 837 | 881 | 925 |

Fig.7

| i\j | 22 | 23 | 24 | 25 | 26 | 27 | 28 | 29 | 30 | 31 | 32 | 33 | 34 | 35 | 36 | 37 | 38 | 39 | 40 | 41 | 42 | 43 | 44 |
|---|---|---|---|---|---|---|---|---|---|---|---|---|---|---|---|---|---|---|---|---|---|---|---|
| 0 | 968 | 1012 | 1056 | 1100 | 26 | 70 | 114 | 158 | 202 | 246 | 290 | 334 | 378 | 422 | 466 | 510 | 554 | 598 | 642 | 686 | 730 | 1118 | 1144 |
| 1 | 1011 | 1055 | 1099 | 25 | 69 | 113 | 157 | 201 | 245 | 289 | 333 | 377 | 421 | 465 | 509 | 553 | 597 | 641 | 685 | 729 | 773 | 1119 | 1145 |
| 2 | 1054 | 1098 | 24 | 68 | 112 | 156 | 200 | 244 | 288 | 332 | 376 | 420 | 464 | 508 | 552 | 596 | 640 | 684 | 728 | 772 | 816 | 1120 | 1146 |
| 3 | 1097 | 23 | 67 | 111 | 155 | 199 | 243 | 287 | 331 | 375 | 419 | 463 | 507 | 551 | 595 | 639 | 683 | 727 | 771 | 815 | 859 | 1121 | 1147 |
| 4 | 22 | 66 | 110 | 154 | 198 | 242 | 286 | 330 | 374 | 418 | 462 | 506 | 550 | 594 | 638 | 682 | 726 | 770 | 814 | 858 | 902 | 1122 | 1148 |
| 5 | 65 | 109 | 153 | 197 | 241 | 285 | 329 | 373 | 417 | 461 | 505 | 549 | 593 | 637 | 681 | 725 | 769 | 813 | 857 | 901 | 945 | 1123 | 1149 |
| 6 | 108 | 152 | 196 | 240 | 284 | 328 | 372 | 416 | 460 | 504 | 548 | 592 | 636 | 680 | 724 | 768 | 812 | 856 | 900 | 944 | 988 | 1124 | 1150 |
| 7 | 151 | 195 | 239 | 283 | 327 | 371 | 415 | 459 | 503 | 547 | 591 | 635 | 679 | 723 | 767 | 811 | 855 | 899 | 943 | 987 | 1031 | 1125 | 1151 |
| 8 | 194 | 238 | 282 | 326 | 370 | 414 | 458 | 502 | 546 | 590 | 634 | 678 | 722 | 766 | 810 | 854 | 898 | 942 | 986 | 1030 | 1074 | 1126 | 1152 |
| 9 | 237 | 281 | 325 | 369 | 413 | 457 | 501 | 545 | 589 | 633 | 677 | 721 | 765 | 809 | 853 | 897 | 941 | 985 | 1029 | 1073 | 1117 | 1127 | 1153 |
| 10 | 280 | 324 | 368 | 412 | 456 | 500 | 544 | 588 | 632 | 676 | 720 | 764 | 808 | 852 | 896 | 940 | 984 | 1028 | 1072 | 1116 | 42 | 1128 | 1154 |
| 11 | 323 | 367 | 411 | 455 | 499 | 543 | 587 | 631 | 675 | 719 | 763 | 807 | 851 | 895 | 939 | 983 | 1027 | 1071 | 1115 | 41 | 85 | 1129 | 1155 |
| 12 | 366 | 410 | 454 | 498 | 542 | 586 | 630 | 674 | 718 | 762 | 806 | 850 | 894 | 938 | 982 | 1026 | 1070 | 1114 | 40 | 84 | 128 | 1130 | 1156 |
| 13 | 409 | 453 | 497 | 541 | 585 | 629 | 673 | 717 | 761 | 805 | 849 | 893 | 937 | 981 | 1025 | 1069 | 1113 | 39 | 83 | 127 | 171 | 1131 | 1157 |
| 14 | 452 | 496 | 540 | 584 | 628 | 672 | 716 | 760 | 804 | 848 | 892 | 936 | 980 | 1024 | 1068 | 1112 | 38 | 82 | 126 | 170 | 214 | 1132 | 1158 |
| 15 | 495 | 539 | 583 | 627 | 671 | 715 | 759 | 803 | 847 | 891 | 935 | 979 | 1023 | 1067 | 1111 | 37 | 81 | 125 | 169 | 213 | 257 | 1133 | 1159 |
| 16 | 538 | 582 | 626 | 670 | 714 | 758 | 802 | 846 | 890 | 934 | 978 | 1022 | 1066 | 1110 | 36 | 80 | 124 | 168 | 212 | 256 | 300 | 1134 | 1160 |
| 17 | 581 | 625 | 669 | 713 | 757 | 801 | 845 | 889 | 933 | 977 | 1021 | 1065 | 1109 | 35 | 79 | 123 | 167 | 211 | 255 | 299 | 343 | 1135 | 1161 |
| 18 | 624 | 668 | 712 | 756 | 800 | 844 | 888 | 932 | 976 | 1020 | 1064 | 1108 | 34 | 78 | 122 | 166 | 210 | 254 | 298 | 342 | 386 | 1136 | 1162 |
| 19 | 667 | 711 | 755 | 799 | 843 | 887 | 931 | 975 | 1019 | 1063 | 1107 | 33 | 77 | 121 | 165 | 209 | 253 | 297 | 341 | 385 | 429 | 1137 | 1163 |
| 20 | 710 | 754 | 798 | 842 | 886 | 930 | 974 | 1018 | 1062 | 1106 | 32 | 76 | 120 | 164 | 208 | 252 | 296 | 340 | 384 | 428 | 472 | 1138 | 1164 |
| 21 | 753 | 797 | 841 | 885 | 929 | 973 | 1017 | 1061 | 1105 | 31 | 75 | 119 | 163 | 207 | 251 | 295 | 339 | 383 | 427 | 471 | 515 | 1139 | 1165 |
| 22 | 796 | 840 | 884 | 928 | 972 | 1016 | 1060 | 1104 | 30 | 74 | 118 | 162 | 206 | 250 | 294 | 338 | 382 | 426 | 470 | 514 | 558 | 1140 | 1166 |
| 23 | 839 | 883 | 927 | 971 | 1015 | 1059 | 1103 | 29 | 73 | 117 | 161 | 205 | 249 | 293 | 337 | 381 | 425 | 469 | 513 | 557 | 601 | 1141 | 1167 |
| 24 | 882 | 926 | 970 | 1014 | 1058 | 1102 | 28 | 72 | 116 | 160 | 204 | 248 | 292 | 336 | 380 | 424 | 468 | 512 | 556 | 600 | 644 | 1142 | 1168 |
| 25 | 925 | 969 | 1013 | 1057 | 1101 | 27 | 71 | 115 | 159 | 203 | 247 | 291 | 335 | 379 | 423 | 467 | 511 | 555 | 599 | 643 | 687 | 1143 | 1169 |

METHOD AND APPARATUS FOR ERROR CORRECTION

FIELD OF THE INVENTION

The present invention relates to a method and apparatus for error correction and, more particularly, to an error correction method and apparatus which executes a syndrome operation without deinterleaving information data, which has been interleaved, and performs error correction.

BACKGROUND OF THE INVENTION

Figure 4:
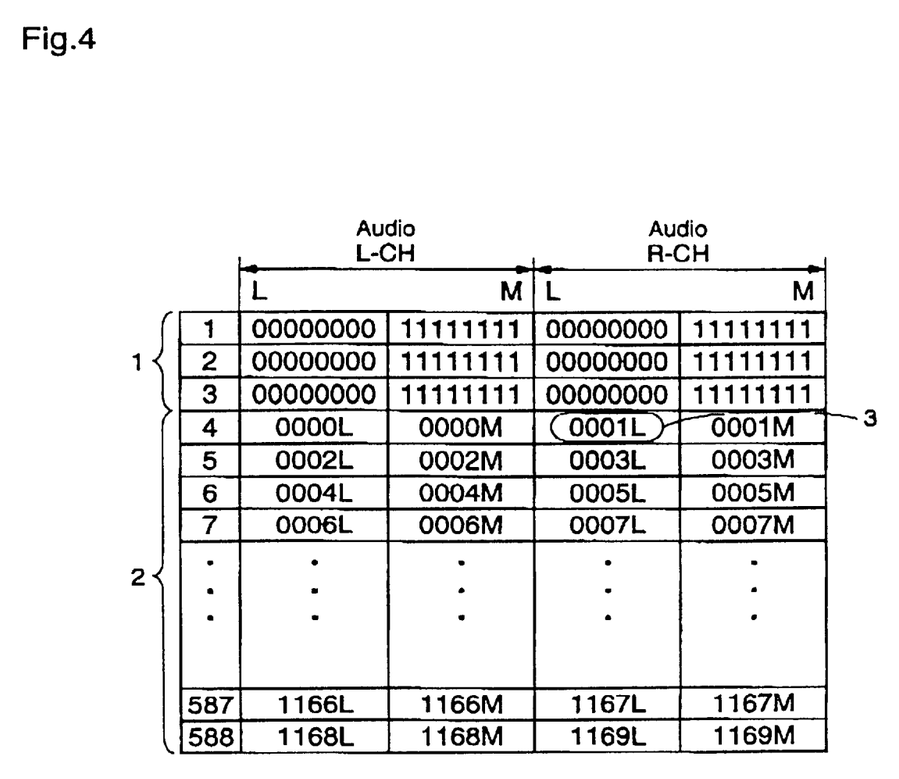
FIG. 4 is a data format of one sector of the CD-ROM, which is represented on the basis of audio data.

A-syndrome operation of error correction processings for the CD-ROM (Compact Disc-Read Only Memory) is described with reference to FIGS. 4 to 7. FIG. 4 is a diagram showing a data format of one sector of the CD-ROM, which is represented on the basis of audio data (L and R stereo signals). L-CH denotes data of the left channel and R-CH denotes data of the right channel. "L" denotes a Least Significant Bit (LSB) and "M" denotes a Most Significant Bit (MSB). Upper three lines denoted by reference numeral 1 show a synchronous pattern representing one sector, and the next 585 lines below numeral 1, denoted by numeral 2, show the pattern of data.

Figure 5:
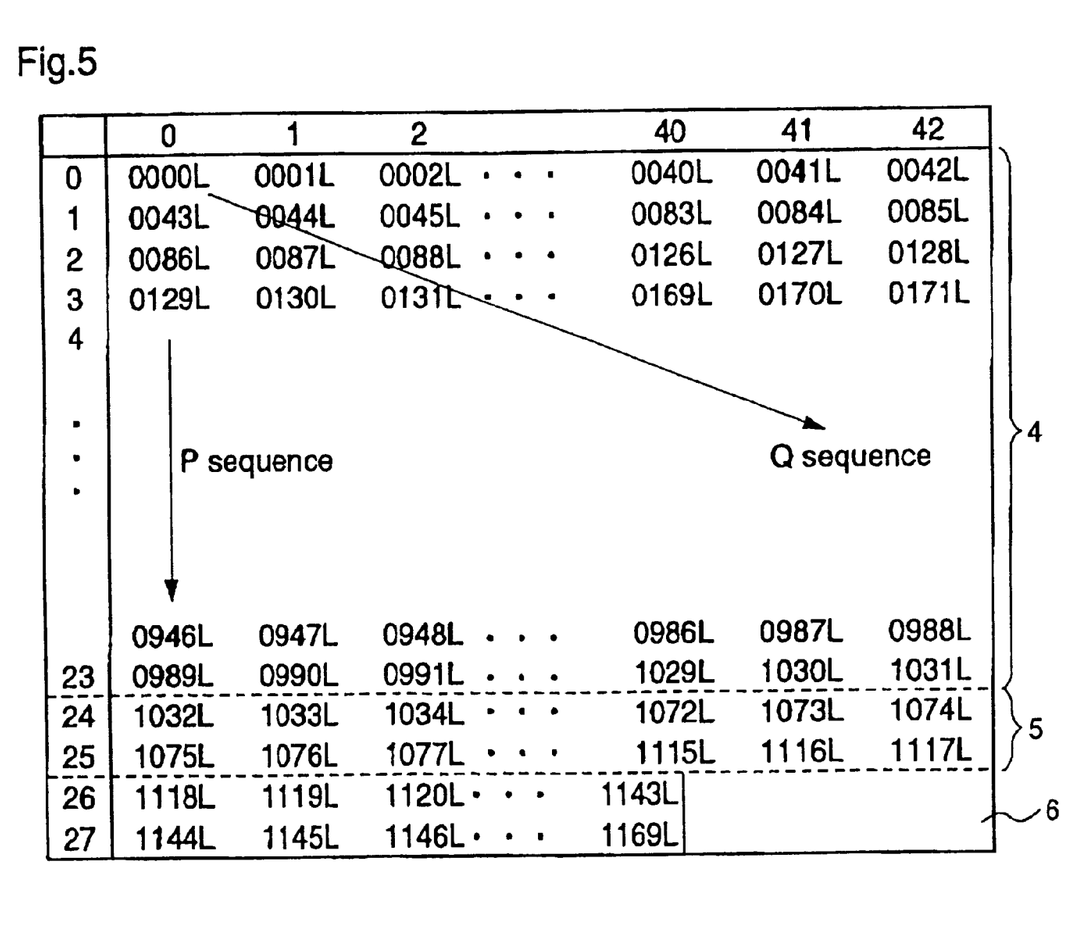
FIG. 5 is a map diagram which is formed by selecting only less significant bytes from one sector of data.

FIG. 5 is a map which is formed by selecting only less significant bytes in the data of one sector shown in FIG. 4. The plane which is composed of only less significant bytes is referred to as a least significant plane. Further, a plane which is composed of only more significant bytes is referred to as a most significant plane. The upper 24 lines denoted by numeral 4 show the header except the synchronous pattern and user data. The next two lines denoted by numeral 5 show P parity and the subsequent two lines denoted by numeral 6 show Q parity. The most significant plane has the same form as that of the least significant plane. The respective planes are subjected to the same ECC (Error Check and Correct). In addition, in the case of the CD-ROM, the ECC is performed for two codeword sequences, i.e., P sequence and Q sequence.

Figure 6:
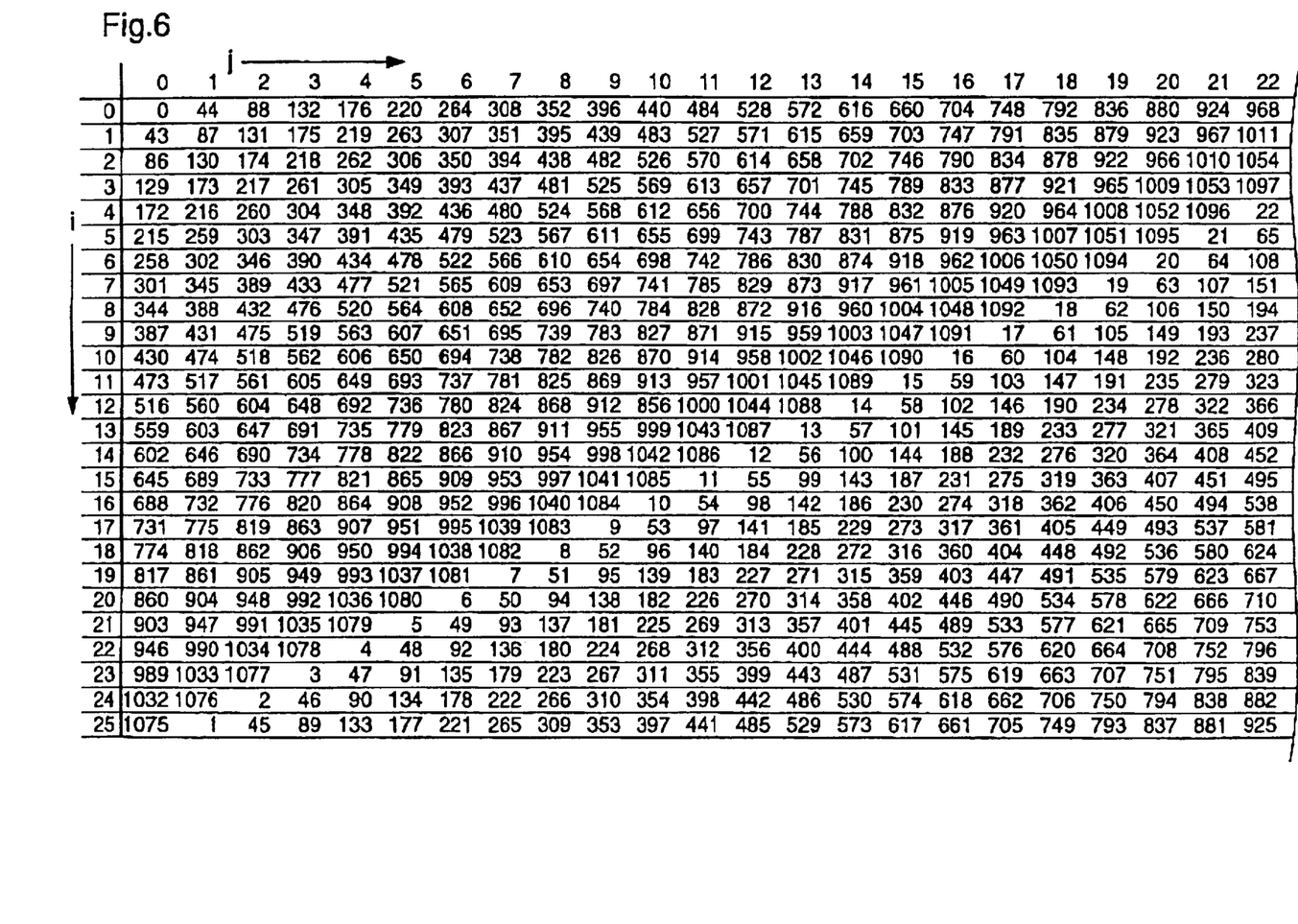
FIG. 6 is a diagram for explaining the order in which a syndrome operation of Q sequence is performed.
Figure 7:
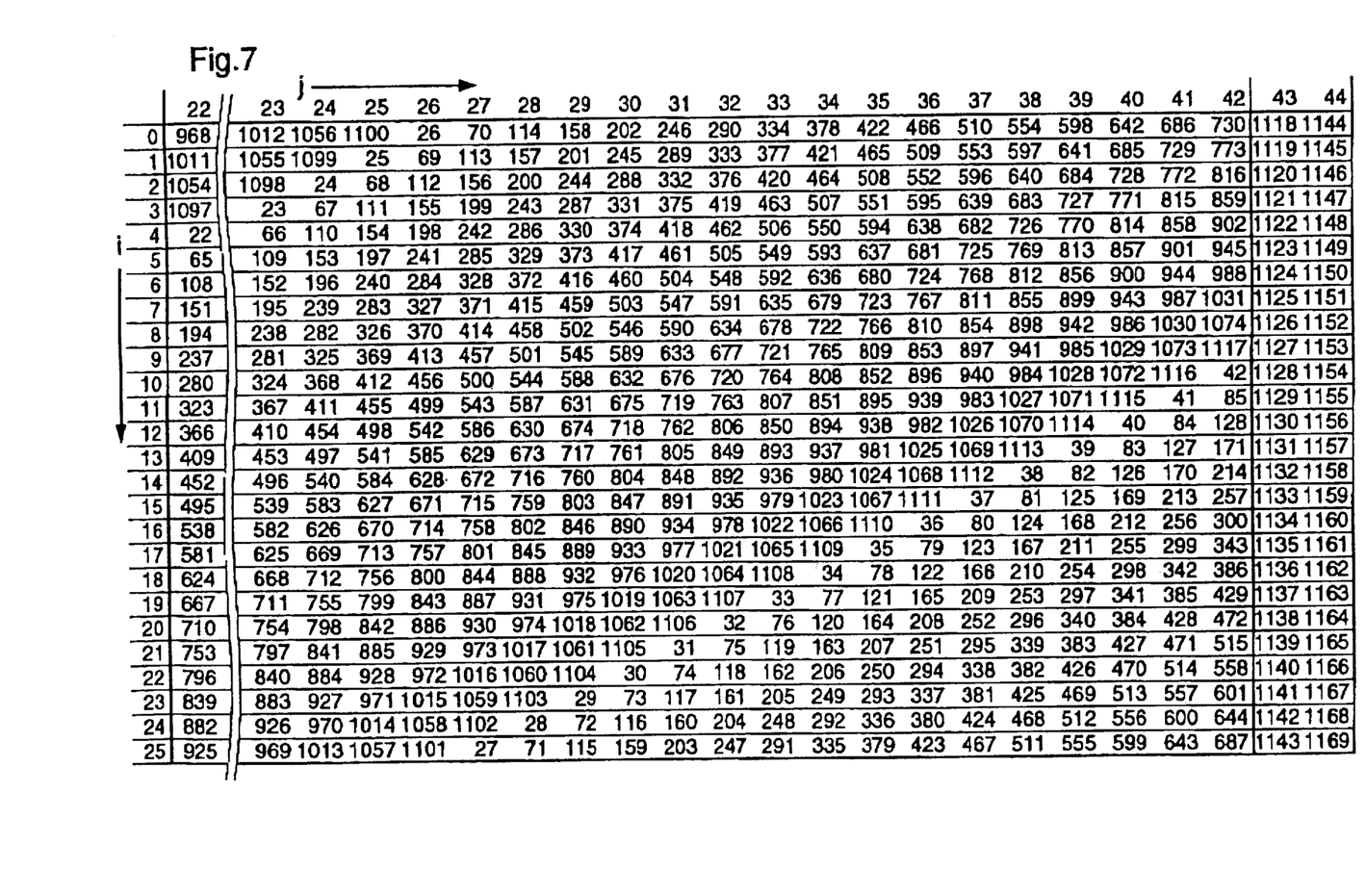
FIG. 7 is a diagram for explaining the order in which the syndrome operation of Q sequence is performed.

FIGS. 6 and 7 show the data of Q sequence shown in FIG. 5, which are rearranged in the direction of row (j). It can be seen that code sequences each having a code length n composed of 45 bytes (j=0–44) are arranged in 26 (i=0–25) rows. When i=0, the syndrome operation is executed with reading data every "44", i.e., "0", "44", "88", . . . . Similarly when i=1, the operation is executed with reading data every "44", i.e., "43", "87", "131", . . . . This is given by the following expression:

$Q=43i+44j$ mod 1118 ($i$ =0–25, $j$=0–44)   (Expression 13)

Japanese Published Patent Application No. Hei.5-12814 shows a method of executing syndrome operations in parallel and performing(error correction, without putting the data of Q sequence which have been rearranged in byte units, i.e., interleaved, in their original places, i.e., without deinterleaving the data. In this method, with utilizing the property that ECCs (Error-Correcting Codes) for the most significant plane and the least significant plane are irrelevant to each other, i.e., independent, 1 byte of data is respectively read on the most significant plane and the least significant plane (referred to as page0 and page1 in this Published Application) successively from the first data of codeword sequences arranged in the direction of row (j) among data stored at contiguous addresses in a buffer memory, i.e., 2 bytes of data are read, and the operations are executed in parallel by two syndrome operation circuits which are provided so as to respectively correspond to the most significant plane and the least significant plane.

As described above, the prior art error correction apparatus reads 1 byte of data on the most significant plane and the least significant plane, respectively, i.e., reads 2 bytes of data in total, successively from the first data of the interleaved data in each codeword sequence, and executes the operations in the two syndrome operation circuits in parallel, thereby increasing the speed of the operations. However, it is difficult to increase the parallelism of the operation to further increase the speed with this error correction apparatus.

In order to more specifically describe this, assume that in addition to 2 bytes of data as in the prior art, 2 bytes of data at the subsequent addresses are further read. In this case, "0001L" and "0001M" are read in addition to "0000L" and "0000M", i.e., 4 bytes of data are read in total. Here, "0000L" and "0000M" correspond to "0" shown in FIG. 6 and are the first (j=0) data in the codeword sequence of i=0. On the other hand, "0001L" and "0001M" correspond to "1" shown in FIG. 6 and are the second (j=1) data in the codeword sequence of i=25.

More specifically, since the order in which "0000L" and "0000M" are subjected to the operations is different from the order in which "0001L" and "0001M" are subjected to the operation, their operations cannot be performed in parallel. In addition, when the operation is started from data halfway through the codeword sequence like "0001L" and "0001M", an error occurs in the syndrome operation result. Thus, it is required to put the interleaved data in the their original places, i.e., deinterleave the data, and then execute the syndrome operation. Accordingly, the parallel operation of the syndrome cannot be performed by merely increasing the number of bytes of read data.

SUMMARY OF THE INVENTION

It is an object of the present invention to provide an error correction method and apparatus for performing a high-speed operation, which can directly execute the operation, without deinterleaving plural bytes of data which are read according to the parallelism of the syndrome operation circuits.

Other objects and advantages of the present invention will become apparent from the detailed description and specific embodiments described are provided only for illustration since various additions and modifications within the spirit and scope of the invention will be apparent to those of skill in the art from the detailed description.

A method for error correction according to a 1st aspect of the present invention comprises a first step of repeating a product-sum operation using (n−s) codewords from an s-th codeword (1≦S≦n−1) halfway through a codeword sequence of a code length n (n is a positive integer) composed of 0th to (n−1)-th codewords, which is taken as an operation start data, to the (n−1)-th codeword, and obtaining a first partial syndrome polynomial; a second step of multiplying the first partial syndrome polynomial by index compensating coefficients to obtain a second partial syndrome polynomial; and a third step of repeating a product-sum operation using s pieces of codewords from the 0th codeword which is a first codeword in the codeword sequence, taken as an operation restart data, to a (s−1)-th codeword on the basis of the second partial syndrome polynomial and obtaining a syndrome polynomial of the codeword sequence. Therefore, the operation can be performed directly without deinterleaving the read data, whereby the high-speed syndrome operation can be realized.

According to a 2nd aspect of the present invention, in the error correction method of the 1st aspect, when the 0th codeword which is the first codeword of the codeword sequence is taken as the operation start data, the product-sum operation is repeatedly performed using n pieces of codewords from the 0th codeword to the (n−1)-th codeword to obtain the syndrome polynomial of the code sequence. Therefore, the high-speed syndrome operation can be performed.

According to a 3rd aspect of the present invention, in the error correction method of the 1st aspect, when the 0th codeword which is the first codeword in the code sequence is taken as the operation start data, the first and second steps are executed to obtain the syndrome polynomial of the codeword sequence. Therefore, the syndrome operation having a high parallelism can be executed.

An apparatus for error correction according to a 4th aspect of the present invention comprises syndrome operation means for repeating a cycle in which a syndrome operation is started taking an s-th codeword ($1 \leq s \leq n-1$) in a codeword sequence i (i is an integer which is 0 or more) of a codeword length n (n is a positive integer) composed of 0th to (n−1)-th codewords as an operation start data, and when the syndrome operation for the s-th codeword is completed, a syndrome operation is performed for a polynomial which is obtained by adding a result of the syndrome operation and a next (s+1)-th codeword, n times, thereby obtaining a syndrome polynomial composed of n terms. The syndrome operation means comprises: addition means for adding a result of a syndrome operation of a p-th ($1 \leq p \leq n-1$) cycle and a codeword of a (p+1)-th cycle to obtain a polynomial composed of(p+1) terms; first Galois field multiplication means for multiplying each term of the polynomial from the addition means by an element $\alpha^i$ $\alpha^y$ of a Galois field to obtain a syndrome polynomial of the (p+1)-th cycle; operation result storage means for containing the syndrome polynomial of the (p+1)-th cycle from the first Galois field multiplication means as an operation interim result; second Galois field multiplication means for multiplying the operation interim result from the operation result storage means by index compensating coefficients, and outputting a partial syndrome; and index compensated output selecting means for selecting one of the operation interim result from the operation result storage means and the partial syndrome from the second Galois field multiplication means, and outputting selected one to the addition means as a result of a syndrome operation in the (p+1)-th cycle, and the index compensated output selecting means selects the partial syndrome from the second Galois field multiplication means in a (n−s)-th cycle in which a syndrome operation of a last codeword in the codeword sequence is performed. Therefore, the operation can be performed directly without deinterleaving the read data, whereby the high-speed syndrome operation can be executed.

According to a 5th aspect of the present invention, in the error correction apparatus of the 4th aspect, a plurality of the syndrome operation means are included, and codewords of plural codeword sequences are respectively input to the syndrome operation means for corresponding codeword sequences, to perform syndrome polynomial operations for the plural codeword sequences in parallel. Therefore, the syndrome operation realizing a high parallelism can be performed, whereby the operation can be executed at high speed.

According to a 6th aspect of the present invention, the error correction apparatus of the 4th or 5th aspect comprises counter means for generating an index compensation cycle signal of a codeword sequence which is subjected to index compensation first among the plural codeword sequences; and delay means for generating h pieces of delay signals corresponding to the number h (h is a positive integer) of the plural syndrome operation means, said delay signals being delayed with respect to the index compensation cycle signal successively by k cycles (k is a positive integer) based on the index compensation cycle signal, and the delay means outputs the delay signals to the index compensated output selecting means included in each of the syndrome operation means as selection signals, respectively, thereby executing the index compensation for the operation interim result in each of the syndrome operation means with delay of k cycles each. Therefore, the index compensation for each codeword sequence can be automatically performed and the syndrome operation can have a high parallelism, whereby the operation can be performed at high speed.

DETAILED DESCRIPTION OF THE PREFERRED EMBODIMENTS

[Embodiment 1]

Figure 1:
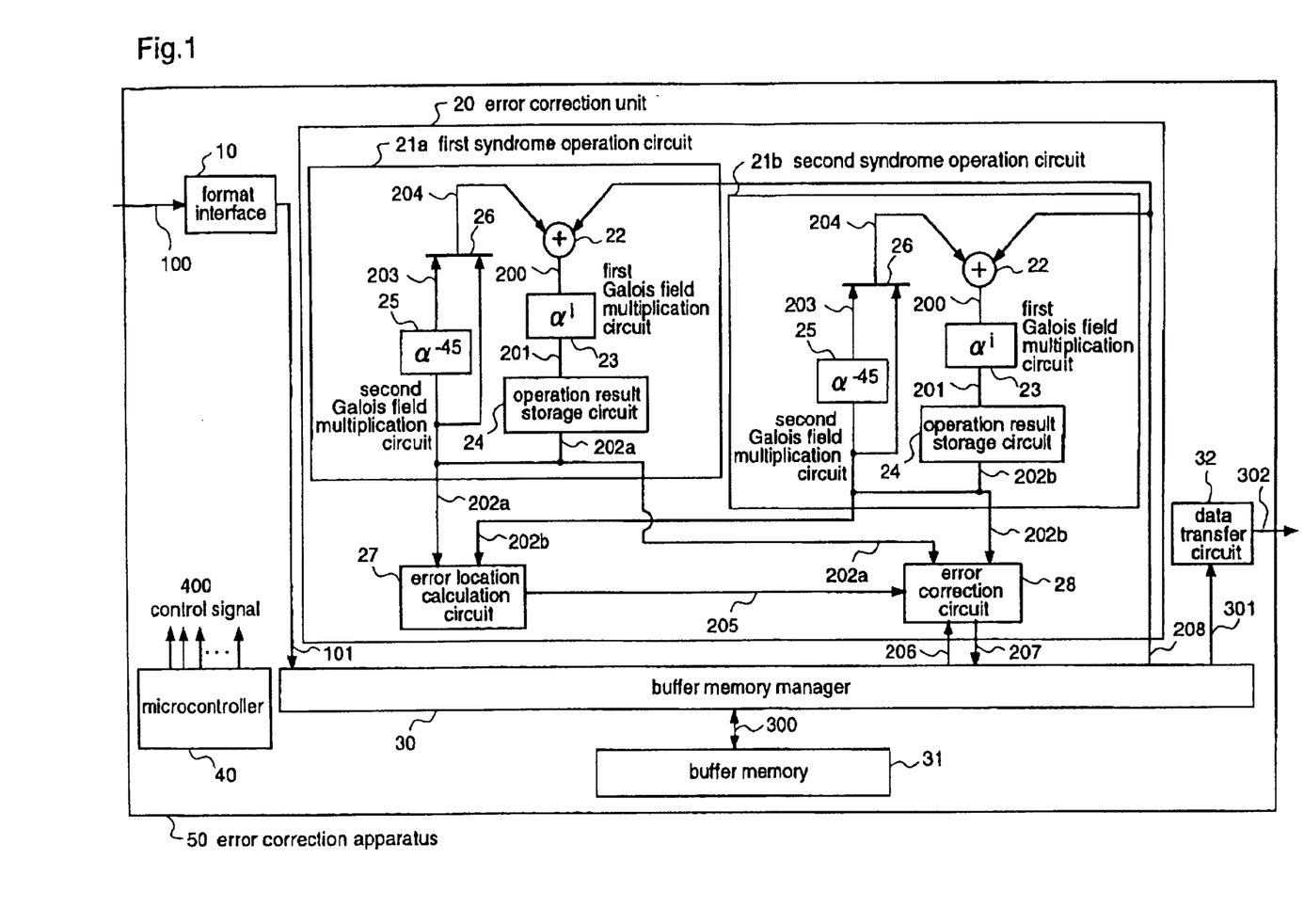
FIG. 1 is a block diagram for explaining a structure of an error correction apparatus 50 according to the present invention.

FIG. 1 is a block diagram for explaining a structure of an error correction apparatus 50 according to the first embodiment of the present invention. The error correction apparatus 50 comprises a format interface 10 for protecting synchronization of input serial data 100 and executing descrambling processing for the serial data 100, a buffer memory 31 containing processed information data from the format interface 10, an error correction unit 20 for executing error correction for information data stored in the buffer memory 31, a data transfer circuit 32 for transferring the data whose error is corrected to an external device, and a buffer memory manager 30 for arbitrating access requests from the format interface 10, the error correction unit 20 and the data transfer circuit 32 to the buffer memory 31 and controlling writing onto the buffer memory 31 and reading from the buffer memory 31.

The error correction unit 20 comprises first and second syndrome operation circuits 21a and 21b each repeatedly executing a product-sum operation for a codeword sequence i having a given codeword length n (n is a positive integer) composed of 0th to (n−1)-th codewords, and obtaining a syndrome polynomial for each codeword sequence, an error location calculation circuit 27 for calculating error locations in the respective codeword sequences from the syndrome operation results 202a and 202b of the first and second syndrome operation circuits 21a and 21b, and an error correction circuit 28 for obtaining error values of the respective codeword sequences from the error locations 205 from the error location calculation circuit 27 and the syndrome operation results 202a and 202b of the first and second syndrome operation circuits 21a and 21b, and executing error correction for each codeword sequence i.

The first and second syndrome operation circuits 21a and 21b each start the operation taking the s-th codeword s ($1 \leq s \leq n-1$) halfway through the codeword sequence n as an operation start data. The first and second syndrome operation circuits 21a and 21b each comprise an addition circuit 22 for adding a syndrome polynomial which is obtained as a syndrome operation result 204 in the p-th ($1 \leq p \leq n-1$) cycle and a codeword 208 of the (p+1)-th cycle in the code sequence i and obtaining a polynomial 200 composed of (p+1) terms, a first Galois field multiplication circuit 23 for multiplying each term of the polynomial 200 from the addition circuit 22 by the element $\alpha^i$ $\alpha^\gamma$ of the Galois field and obtaining a syndrome polynomial 201 of the (p+1)-th cycle, an operation result storage circuit 24 containing the syndrome polynomial 201 of the (p+1)-th cycle from the first Galois field multiplication circuit 23 as the operation interim result, a second Galois field multiplication circuit 25 for multiplying the operation interim results 202 from the operation result storage circuit 24, i.e., the result 202a in the first syndrome operation circuit 21a and the result 202b in the second syndrome operation circuit 21b by index compensating coefficients, and outputting the obtained result as a partial syndrome, and an index compensated Output selecting circuit 26 for selecting one of the operation interim result 202 from the operation result storage circuit 24 and the partial syndrome 203 from the second Galois field multiplication circuit 25, and outputting the selected one to the addition circuit 22 as a syndrome operation result of the (p+1)-th cycle. The index compensated output selecting circuit 26 is constructed so as to select the partial syndrome from the second Galois field multiplication circuit 25 in the (n–s)-th cycle when the syndrome operation for the last codeword in the codeword sequence is performed.

As described above, the error correction unit 20 comprises the two syndrome operation circuits 21, and the codewords of two codeword sequences which are read from the buffer memory 31 are input to the corresponding syndrome operation circuits 21a and 21b, respectively, for each codeword sequence, and the syndrome polynomial operations for the two codeword sequences are performed in parallel while the index compensation of the operation interim result is properly performed halfway through the syndrome operation, as needed.

Further, though not shown in the figure, a microcontroller 40 for controlling the operations of the respective circuits in the error correction apparatus 50 is provided with a counter means for generating an index compensation cycle signal for a codeword sequence which is first subjected to the index compensation among the codeword sequences, and a delay means for generating "h" delay signals, which are delayed with respect to the index compensation cycle signal successively by "k" g cycles ("k" is a positive integer), i.e., 0×k cycles, 1×k cycles, . . . , (h–1)×k cycles, based on the index compensation cycle signal according to the number "h" ("h" is a positive integer) of syndrome operation circuits. This delay means outputs the delay signal to the index compensated output selecting circuit 26 included in each of the syndrome operation circuits 21a and 21b as the selection signal. Accordingly, the error correction unit 20 is constructed so that the index compensation of the syndrome polynomial in the respective syndrome operation circuits 21a and 21b are executed with the delay of k cycles each.

Next, the operation of the error correction apparatus 50 will be described. Initially, the serial data 100 is input from a Compact Disc-Digital Signal Processor (not shown) to the error correction apparatus 50. The serial data 100 is subjected to the synchronization protection and the descrambling processing by the format interface 10. Processed data 101 is stored in the buffer memory 31 via the buffer memory manager 30. The buffer memory manager 30 arbitrates access requests from plural bus masters such as the format interface 10, the error correction unit 20 and the data transfer circuit 32 to the buffer memory 31, and controls writing/reading onto/from the buffer memory 31.

Data 208 read from the buffer memory 31 is input to the error correction unit 20, then the syndrome operation results 202a and 202b are obtained by the first syndrome operation circuit 21a and the second syndrome operation circuit 21b, and the obtained syndrome operation results are output to the error location calculation circuit 27 and the error correction circuit 28. Here, the syndrome operation circuits 21a and 21b have the same structure. In each of the syndrome operation circuits, the syndrome operation for codeword sequences assigned to each circuit is performed.

To be specific, in the error correction unit 20, two codeword sequence data 300 are read from the buffer memory 31, then the codeword sequences are assigned to the first and second syndrome operation circuits 21a and 21b and input thereto via the buffer memory manager 30, respectively. In each of the first and second syndrome operation circuits 21a and 21b, the syndrome polynomial operation is started successively from a codeword as the operation start data of the codeword sequence. These syndrome polynomial operations are performed in parallel by the first and second syndrome operation circuits 21a and 21b.

In each of the syndrome operation circuits 2 1, when the codeword as the operation start data of the codeword sequence is input, the input codeword is input to the first Galois field multiplication circuit 23 through the addition circuit 22. In the first Galois field multiplication circuit 23, the input codeword is multiplied by the element $\alpha^i$ $\alpha^\gamma$ of the Galois field and the multiplication result 201 is output to the operation result storage circuit 24. In the operation result storage circuit 24, the input multiplication result 201 is stored as the operation interim result. The operation interim result from the operation result storage circuit 24 is selected by the index compensated output selecting circuit 26, and output to the addition circuit 22 as the syndrome operation result of the first cycle.

In the next second cycle, the syndrome operation result of the first cycle from the index compensated output selecting circuit 26 and a codeword in the second operation order are added by the addition circuit 22 and thereby the polynomial 200 composed of two terms is obtained. In the first Galois field multiplication circuit 23, each of the terms of the polynomial 200 is multiplied by the element $\alpha^1$ $\alpha^\gamma$ of the Galois field and the syndrome polynomial 201 of the second cycle is obtained. The obtained syndrome polynomial 201 of the second cycle is stored in the operation result storage circuit 24 as the operation interim result. The operation interim result from the operation result storage circuit 24 is selected by the index compensated output selecting circuit 26 and output to the addition circuit 22.

Similarly, in the third cycle, the syndrome operation result of the second cycle from the index compensated output selecting circuit 26 and a codeword in the third operation order are added by the addition circuit 22 and the polynomial 200 composed of three terms is obtained. In the first Galois field multiplication circuit 23, each term of the polynomial 200 is multiplied by the element $\alpha^i \alpha^\gamma$ of the Galois field and the syndrome polynomial 201 of the third cycle is obtained. The obtained syndrome polynomial 201 of the third cycle is stored in the operation result storage circuit 24 as the operation interim result.

The above cycle is repeated by each of the first and second syndrome operation circuits 21a and 21b up to the (n−1)-th codeword, i.e., the last codeword (n−1) in the codeword sequence from each operation start data.

Then, when the syndrome operation reaches the codeword (n−1) which is arranged last in the codeword sequence in the first or second syndrome operation circuit 21a or 21b, the index compensated output selecting circuit 26 selects the output from the second Galois field multiplication circuit 25, i.e., the partial syndrome which is obtained by multiplying the operation interim result 202 from the operation result storage circuit 24 by the index compensating coefficients $\alpha^{-n}$, i.e:, $\alpha^{-45}$ in this embodiment, and outputs the selected partial syndrome to the addition circuit 22.

To be specific, when the syndrome operation is started taking the codeword s (1≦s≦n−1) halfway through the codeword sequence as the operation start data, the error occurs in the index of the obtained syndrome polynomial from the first term. Accordingly, the index compensation of the obtained syndrome polynomial is performed once in the (n−s)-th cycle halfway through the syndrome operation for the codeword sequence. In this index compensation, when the operation start data is a codeword which is arranged first in the codeword sequence, the index of the obtained syndrome polynomial has no error. However, when the index compensation is performed also in the case where the operation is started from the codeword which is arranged first in the codeword sequence, the commonality of processing with the other operation start data is attained. In addition, the compensation for the whole of the finally obtained syndrome polynomial is properly performed in the processing subsequent to the syndrome operation.

In the addition circuit 22, the input partial syndrome and the codeword of the next cycle, i.e., the codeword which is arranged at the head of tile codeword sequence are added, and the addition result 200 is input to the first Galois field multiplication circuit 23. The addition result 200 is multiplied by the element $\alpha^i$–$\alpha^\gamma$ of the Galois field by the first Galois field multiplication circuit 23, and the multiplication result 201 is stored in the operation result storage circuit 24 as the operation interim result. The operation interim result from tile operation result storage circuit 24 is selected by the index compensated output selecting circuit 26, input to the addition circuit 22, and added to the codeword of the next cycle by the addition circuit 22. Subsequently, the above cycle is repeated until the syndrome operation for the assigned code sequences i is completed.

When the syndrome operations for the respectively assigned codewords i are completed in the first and second syndrome operation circuits 21a and 21b, the obtained syndrome operation results 202a and 202b are stored in the operation result storage circuits 24, respectively. Thereby, the syndrome operations can be performed in parallel.

In the error location calculation circuit 27, the error locations 205 are obtained from the syndrome operation results 202a and 202b which are input from the respective operation result storage circuits 24 in the first and second syndrome operation circuits 21a and 21b, respectively, and output to the error correction circuit 28.

In the error correction circuit 28, the error values are obtained from the error locations 205 which are output by the error location calculation circuit 27 and the syndrome operation results 202a and 202b, respectively. When there is a correctable error, error data 206 is read out and subjected to the error correction. Data 207 which has been subjected to the error correction is written again to the buffer memory 31.

Data 300 which has been subjected to the error correction is read from the buffer memory 31, data 301 is input to the data transfer circuit 32 via the buffer memory manager 30, and transfer data 302 are output from the error correction apparatus 50 to the external device such as the host computer.

The overall control for these operations is performed on the basis of control signal 400 output by the microcontroller 40.

Next, a detailed description is given of a series of arithmetic processing which is performed by the error correction unit 20.

The syndrome operation results 202a and 202b obtained by the first and second syndrome operation circuits 21a and 21b are given by the following polynomials (Expression 1) to (Expression 6):

$$i=0 \begin{cases} S_0 = D_0 \times \alpha^0 + D_{44} \times \alpha^0 + D_{88} \times \alpha^0 + & \text{(Expression 1)} \\ \quad D_{132} \times \alpha^0 + D_{176} \times \alpha^0 + \cdots + D_{220} \times \alpha^0 + \cdots + \\ \quad D_{686} \times \alpha^0 + D_{730} \times \alpha^0 + D_{1118} \times \alpha^0 + \\ \quad D_{1144} \times \alpha^0 \\ S_1 = D_0 \times \alpha^{44} + D_{44} \times \alpha^{43} + D_{88} \times \alpha^{42} + & \text{(Expression 2)} \\ \quad D_{132} \times \alpha^{41} + D_{176} \times \alpha^{40} + D_{220} \times \alpha^{39} + \cdots + \\ \quad D_{686} \times \alpha^3 + D_{730} \times \alpha^2 + D_{1118} \times \alpha^1 + \\ \quad D_{1144} \times \alpha^0 \end{cases}$$

$$i=1 \begin{cases} S_0 = D_{43} \times \alpha^0 + D_{87} \times \alpha^0 + D_{131} \times \alpha^0 + & \text{(Expression 3)} \\ \quad D_{175} \times \alpha^0 + D_{219} \times \alpha^0 + D_{263} \times \alpha^0 + \cdots + \\ \quad D_{729} \times \alpha^0 + D_{773} \times \alpha^0 + D_{1119} \times \alpha^0 + \\ \quad D_{1145} \times \alpha^0 \\ S_1 = D_{43} \times \alpha^{44} + D_{87} \times \alpha^{43} + D_{131} \times \alpha^{42} + & \text{(Expression 4)} \\ \quad D_{175} \times \alpha^{41} + D_{219} \times \alpha^{40} + D_{263} \times \\ \quad \alpha^{39} + \cdots + D_{729} \times \alpha^3 + D_{773} \times \alpha^2 + \\ \quad D_{1119} \times \alpha^1 + D_{1145} \times \alpha^0 \end{cases}$$

$$i=25 \begin{cases} S_0 = D_{1075} \times \alpha^0 + D_1 \times \alpha^0 + D_{45} \times \alpha^0 + & \text{(Expression 5)} \\ \quad D_{89} \times \alpha^0 + D_{133} \times \alpha^0 + D_{177} \times \alpha^0 + \cdots + \\ \quad D_{643} \times \alpha^0 + D_{687} \times \alpha^0 + D_{1145} \times \alpha^0 + \\ \quad D_{1169} \times \alpha^0 \\ S_1 = D_{1075} \times \alpha^{44} + D_1 \times \alpha^{43} + D_{45} \times \alpha^{42} + & \text{(Expression 6)} \\ \quad D_{89} \times \alpha^{41} + D_{133} \times \alpha^{40} + D_{177} \times \alpha^{39} + \cdots + \\ \quad D_{643} \times \alpha^3 + D_{687} \times \alpha^2 + D_{1143} \times \alpha^1 + \\ \quad D_{1169} \times \alpha^0 \end{cases}$$

In the case of CD-ROM, two syndromes $S_0$ and $S_1$ are defined for each codeword sequence. $S_0$ is obtained by only adding received data, i.e., only obtaining an exclusive-OR of the received data, because the element $\alpha^0$ of the Galois field is 1. Since the addition result does not depend on the addition order, this is not described here and the description is given of only $S^1$ particularly with regard to the case where the syndrome operation on the least significant plane is performed in parallel in two codeword sequences.

Figure 2:
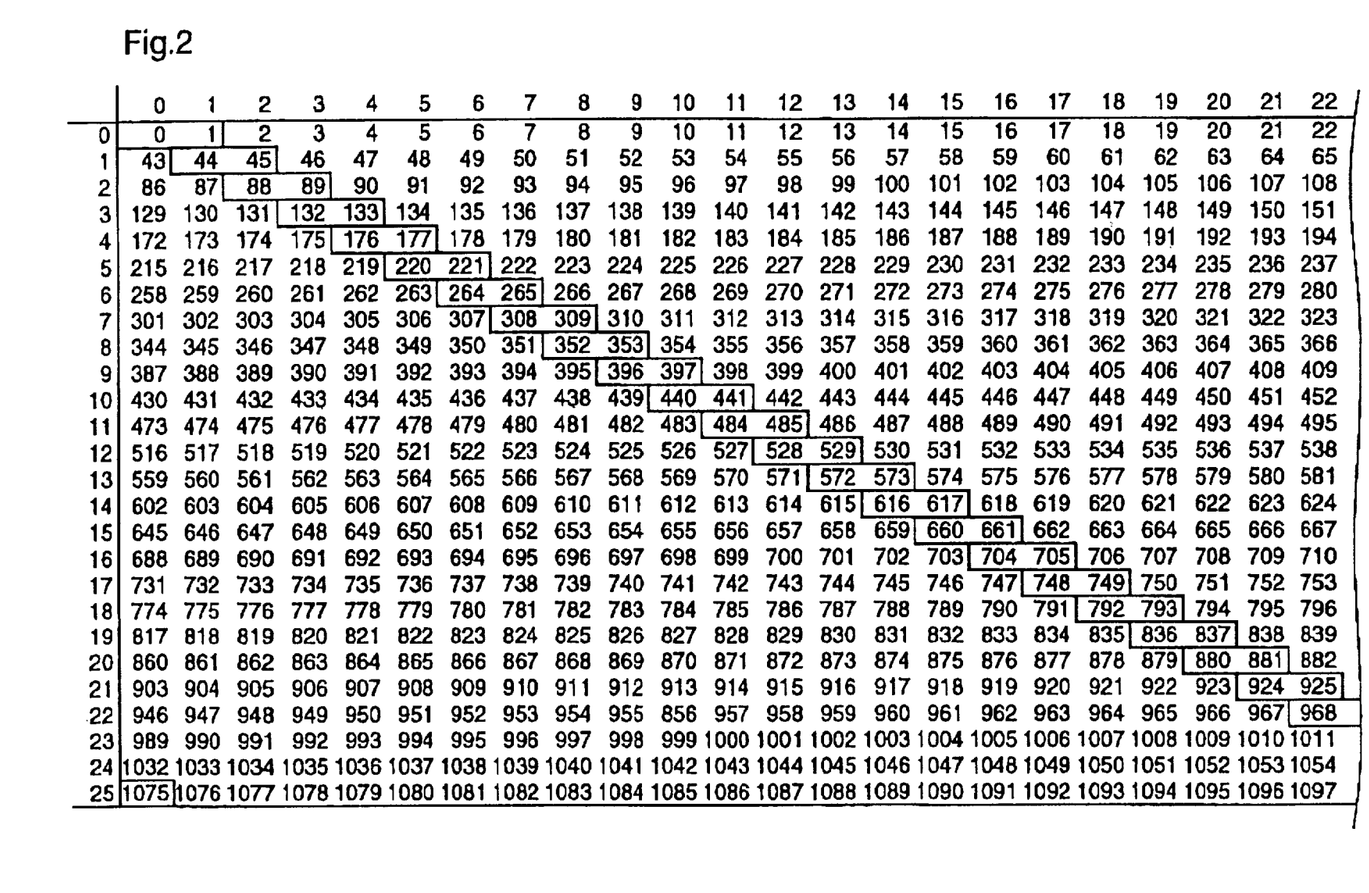
FIG. 2 is a diagram for explaining an operation of accessing data in a syndrome operation for Q sequence according to the present invention.
Figure 3:
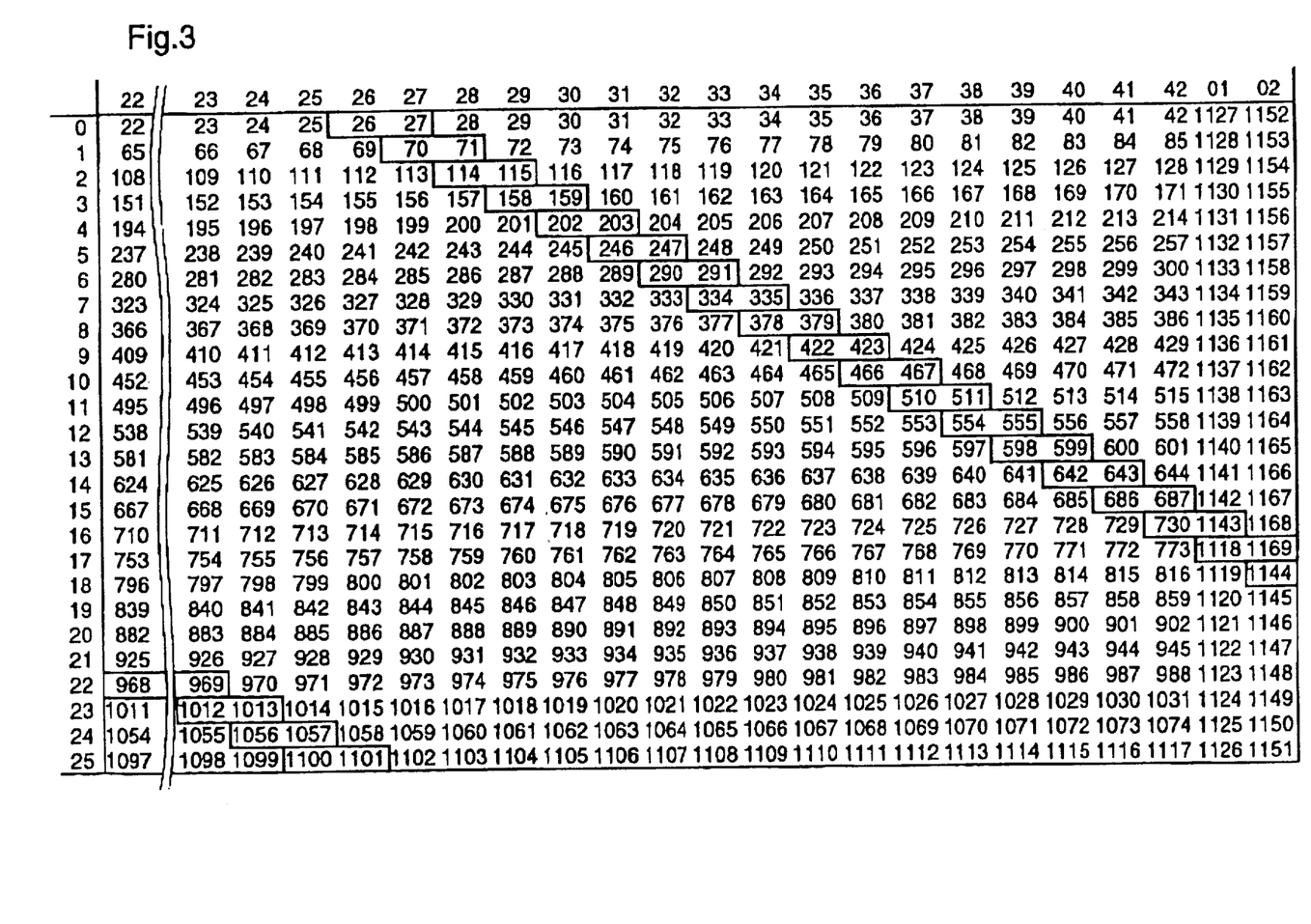
FIG. 3 is a diagram for explaining the operation of accessing data in the syndrome operation for Q sequence according to the present invention.

With reference to FIGS. 6 and 7, assuming that the syndrome operations are performed for the codeword sequences, of i=0 and i=25 which are read from the buffer memory 31 and the codeword sequence of i=0 is subjected to the syndrome operation by the first syndrome operation circuit 21a and the codeword sequence of i=25 is subjected to the syndrome operation by the second syndrome operation circuit 21b respectively. FIGS. 2 and 3 show FIG. 4 in more detail and, more particularly, these figures show the operation order in which the codeword sequences of i=0 and i=25 are subjected to the syndrome operations in parallel.

With reference to FIG. 2, "0, 1" is read as the data 208 in the first cycle, and then "44, 45" is read in the following second cycle. To the first syndrome operation circuit 21a, "0" is input and then "144" is input subsequent to "0". To the second syndrome operation circuit 21b, "1" is input and then "45" is input subsequent to "1". Here, "0" corresponds to "0000L" and "1" corresponds to "0001L" shown in FIG. 4 or 5. In addition, "44" corresponds to "0044L" and "45" corresponds to "0045L".

It can be easily seen from FIGS. 2 and 3 that 2 byte of data at contiguous addresses are read except for cases where Q parity is included like in the case of "730, 1143", "1118, 1169" and "1144, 1075". In addition, "26, 27" are read out subsequent to "1100, 1101" and thereby it can be seen that wrapping occurs because of the residue arithmetic In passing, as seen in FIG. 6, the first (j=0) data is initially read as the operation start data s in the case of the codeword sequence i=0 while the second (j=1) data is read in the case of the codeword sequence i=25. The operations are started from the data of j=0 in the codeword sequence of i=0 and from the data of j=1 in the codeword sequence of i=25, respectively.

The multiplication for the index compensation is performed for the data 202 after the operation is executed for the last data in the codeword sequence (j=44), for example data "1169" in the 44th cycle in the case of the codeword sequence of i=25. This multiplication for the index compensation is performed in the cycles varying with the codeword sequence. In general, the index compensation cycle is given by $$c=n-s \qquad \text{(Expression 14)}$$

Here, c is the index compensation cycle, i is the codeword length, and s is the operation start data.

In the case of code sequence of i=0, the operation is started from the first data (j=0) and essentially the index compensation cycle is not required. However, when it is generalized that the index compensation is performed in the 45th cycle also in the codeword sequence of i=0 as shown in (Expression 14), the index compensation cycle differs by one cycle between adjacent codeword sequences for which the parallel operations are performed. Utilizing this property, when the codeword sequences of i=0 and i=25 are subjected to the operations in parallel, "44" is set in an index compensation cycle counter (not shown) provided in the microcontroller 40 in agreement with the codeword sequence of i=25. Further, a signal which is delayed based on the index compensation cycle signal by one cycle is generated by the delay circuit. Then, the index compensations are executed in the 45th cycle using the index compensation cycle signal in the first syndrome operation circuit 21a which subjects the code sequence of i=0 to the operation, and in the 44th cycle using the signal which is delayed with respect to the index compensation cycle signal by one cycle in the second syndrome operation circuit 21b which subjects the code sequence of i=25 to the operation, respectively.

When the syndrome operation is executed in this way, the polynomials as shown in (Expression 7), (Expression 8) and (Expression 9) among the following expressions are obtained at the end of the operation, and stored in the operation result storage circuit 24.

$$i=0 \begin{cases} S_1 = ((\cdots((D_0 \times \alpha^1 + D_{44}) \times \alpha^1 + D_{88}) \times \alpha^1 + \\ \quad D_{132}) \times \alpha^1 + D_{176}) \times \alpha^1 + D_{220}) + \alpha^1 + \cdots + \\ \quad D_{686}) \times \alpha^1 + D_{730}) \times \alpha^1 + D_{1118}) \times \alpha^1 + D_{1144} \\ = D_0 \times \alpha^{44} + D_{44} \times \alpha^{43} + D_{88} \times \alpha^{42} + D_{132} \times \\ \quad \alpha^{41} \times D_{176} \times \alpha^{40} + D_{220} \times \alpha^{39} + \cdots + D_{686} \times \\ \quad \alpha^3 + D_{730} \times \alpha^2 + D_{1118} \times \alpha^1 + D_{1144} \times \alpha^0 \\ S_1' = ((\cdots((D_0 \times \alpha^2 + D_{44}) \times \alpha^1 + D_{88}) \times \alpha^1 + \\ \quad D_{132}) \times \alpha^1 + D_{176}) \times \alpha^1 + D_{220}) + \alpha^1 + \cdots + \\ \quad D_{686}) \times \alpha^1 + D_{730}) \times \alpha^1 + D_{1118}) \times \alpha^1 + \\ \quad D_{1144} \times \underline{\alpha^{-45}} \leftarrow \text{index compensation} \\ \quad \text{(It is for commonality of processing and} \\ \quad \text{essentially not required)} \\ = D_0 \times \alpha^{-1} + D_{44} \times \alpha^{-2} + D_{88} \times \alpha^{-3} + D_{132} \times \\ \quad \alpha^{-4} \times D_{176} \times \alpha^{-5} + D_{220} \times \alpha^{-6} + \cdots + D_{686} \times \\ \quad \alpha^{-42} + D_{730} \times \alpha^{-43} + D_{1118} \times \alpha^{-44} + D_{1144} \times \\ \quad \alpha^{-45} \\ S_1 = S_1' \times \alpha^{45} \qquad \text{(Expression 10)} \end{cases}$$

(Expression 2)

(Expression 7)

codeword length n: 45
operation start data s: 0
compensation cycle c=n−s: 45
index of coefficient by which the whole is multiplied
   index=−(n−s): −45

$$i=0 \begin{cases} S_1 = ((\cdots((D_{43} \times \alpha^1 + D_{87}) \times \alpha^1 + D_{132}) \times \alpha^1 + \\ \quad D_{175}) \times \alpha^1 + D_{219}) \times \alpha^1 + D_{263}) + \alpha^2 + \cdots + \\ \quad D_{729}) \times \alpha^1 + D_{773}) \times \alpha^1 + D_{1119}) \times \alpha^1 + D_{1145} \\ = D_{43} \times \alpha^{44} + D_{87} \times \alpha^{43} + D_{131} \times \alpha^{42} + D_{175} \times \\ \quad \alpha^{41} \times D_{219} \times \alpha^{40} + D_{263} \times \alpha^{39} + \cdots + D_{729} \times \\ \quad \alpha^3 + D_{773} \times \alpha^2 + D_{1119} \times \alpha^1 + D_{1145} \times \alpha^0 \\ S_1' = ((\cdots((D_{25} \times \alpha^1 + D_{69}) \times \alpha^1 + D_{113}) \times \alpha^1 + \\ \quad D_{157}) \times \alpha^1 + D_{201}) \times \alpha^1 + D_{245}) \times \alpha^1 + \cdots + \\ \quad D_{1119}) \times \alpha^1 + D_{1145}) \times \alpha)^1 \times \underline{\alpha^{-45}} + D_{43}) \times \\ \quad \alpha^1 + \cdots + D_{1055}) \times \alpha^1 + \qquad \uparrow \\ \quad D_{1099}) \qquad \qquad \text{index compensation} \\ = D_{43} \times \alpha^{24} + D_{87} \times \alpha^{23} + D_{131} \times \alpha^{22} + D_{175} \times \\ \quad \alpha^{21} \times D_{219} \times \alpha^{20} + D_{263} \times \alpha^{19} + \cdots + D_{729} \times \\ \quad \alpha^{-17} + D_{773} \times \alpha^{-18} + D_{1119} \times \alpha^{-19} + D_{1145} \times \\ \quad \alpha^{-20} \\ S_1 = S_1' \times \alpha^{20} \qquad \text{(Expression 11)} \end{cases}$$

(Expression 4)

(Expression 8)

codeword length n: 45
operation start data s: 25
compensation cycle c=n−s
index of coefficient by which the whole is multiplied
   index=−(n−s): −20

$$i = 25 \begin{cases} S_1 = ((\cdots((D_{1075} \times \alpha^1 + D_1) \times \alpha^1 + \\ \quad D_{45}) \times \alpha^1 + D_{89}) \times \alpha^1 + D_{133}) \times \alpha^1 + \\ \quad D_{177}) + \alpha^1 + \cdots + D_{643}) \times \alpha^1 + \\ \quad D_{687}) \times \alpha^1 + D_{1143}) \times \alpha^1 + D_{1169} \\ = D_{1075} \times \alpha^{44} + D_1 \times \alpha^{43} + D_{45} \times \alpha^{42} + \\ \quad D_{89} \times \alpha^{41} \times D_{133} \times \alpha^{40} + D_{177} \times \\ \quad \alpha^{39} + \cdots + D_{643} \times \alpha^3 + D_{687} \times \alpha^2 + \\ \quad D_{1143} \times \alpha^1 + D_{1169} \times \alpha^0 \\ S_1' = ((\cdots((D_1 \times \alpha^1 + D_{45}) \times \alpha^1 + D_{89}) \times \alpha^1 + \\ \quad D_{133}) \times \alpha^1 + D_{177}) \times \alpha^1 + \cdots + D_{643}) \times \\ \quad \alpha^1 + D_{687}) \times \alpha^1 + D_{1143}) \times \alpha^1 + D_{1169}) \times \\ \quad \alpha)^1 \times \underline{\alpha^{-45}} + \\ \qquad\qquad\quad \uparrow \\ \quad D_{1075} \text{ index compensation} \\ = D_{1075} \times \alpha^0 + D_1 \times \alpha^{-1} + D_{45} \times \\ \quad \alpha^{-2} + D_{89} \times \alpha^{-3} \times D_{133} \times \alpha^{-4} + D_{177} \times \\ \quad \alpha^{-5} + \cdots + D_{643} \times \alpha^{-41} + D_{687} \times \alpha^{-42} + \\ \quad D_{1143} \times \alpha^{-43} + D_{1169} \times \alpha^{-44} \\ \qquad\qquad S_1 = S_1' \times \alpha^{44} \end{cases}$$

(Expression 6)

(Expression 9)

(Expression 12)

codeword length n: 45
operation start data s: 1
compensation cycle c=n−s: 44
index of coefficient by which the whole is multiplied
index=−(n−s): −44

When these expressions are compared with the syndrome (Expression 2), (Expression 4) and (Expression 6) which are to be obtained, it can be seen that the whole is multiplied by the coefficients, respectively, as shown in (Expression 10), (Expression 11) and (Expression 12). When the index part of the coefficients $\alpha^{index}$ by which the whole is multiplied is generally shown, $$\text{index}=-(n-s) \qquad \text{(Expression 15)}$$

Therefore, when the coefficients by which the whole of the syndrome polynomial is multiplied are compensated, the syndrome polynomial which is to be obtained is obtained. Here, the coefficients by which the whole of the syndrome polynomial is multiplied can be compensated as needed during the subsequent processing, for example, during the processing for obtaining the error location.

As described above, in the error correction apparatus according to the first embodiment, each of the syndrome operation circuits is provided with the second Galois field multiplication circuit for the index compensation, to perform the index compensation when required during the operation. Therefore, the syndrome operation can be performed without deinterleaving data of Q sequence. Accordingly, the syndrome operation circuit which corresponds to the parallelism, i.e., the number of bytes of data to be read can be provided, whereby the operation can be directly performed without deinterleaving the read data. Consequently, the syndrome operation can be executed at high speed.

In addition, only when the data which has been read from the buffer memory is supplied to the syndrome operation circuit without being deinterleaved, the syndrome operations having a high parallelism can be executed. Therefore, useless accesses to the buffer memory which are generated to deinterleave the data are dispensed with and the power consumption can be reduced, as well as the reduction in performance due to the waiting which occurs in the syndrome operation circuit while deinterleaving the data can be avoided. Further, when the parallelism of the syndrome operation circuits is decided according to the required performance, the error correction apparatus which has an optimum circuit scale and a high error correction performance can be provided.

While the description is given of only the syndrome S1, the syndromes S0 and S1 can be also obtained in parallel. However, as for S0, since the coefficients are 1, the first Galois field multiplication circuit 23 is not required and thereby the operation result does not depend on the operation order. Therefore, it is unnecessary to perform the index compensation, and accordingly the second Galois field multiplication circuit 25 and the index compensated output selecting circuit 26 are dispensed with. That is, the syndrome S0 can be obtained only by the addition circuit 22 and the operation result storage circuit 24.

In this first embodiment, the 2-byte parallel operation, i.e., the parallel operation for two codeword sequences is described. However, when the number of bytes of data to be read is increased more and the corresponding number of syndrome operation circuits are provided, the high-speed processing according to the number of bytes of the data to be read can be attained. In addition, while the syndrome operation for the Q sequence on the least significant plane is described here for the simplicity, the operation can be performed similarly for the most significant plane. Further, since the buffer memory contains the data of most significant plane and the least significant plane contiguously, when the data are read in parallel the parallel operation for the codeword sequences on the most significant plane and the least significant plane can be easily performed.

In addition, while the index compensation cycle counter is provided in the microcontroller 40, it can be provided in the error correction unit 20.

What is claimed is:

1. A method for error correction comprising:
   repeating a product-sum operation using n−s codewords from an s-th codeword halfway through a codeword sequence of a codeword length n, composed of 0th to (n−1)-th codewords, which is taken as an operation start data, to the (n−1)-th codeword, and obtaining a first partial syndrome polynomial;
   multiplying the first partial syndrome polynomial by index compensating coefficients to obtain a second partial syndrome polynomial; and
   repeating a product-sum operation using s pieces of codewords from the 0th codeword which is a first codeword in the codeword sequence, taken as an operation restart data, to a (s−1)-th codeword on the basis of the second partial syndrome polynomial and obtaining a syndrome polynomial of the code sequence,
   wherein $1 \leq s \leq n-1$, and
   wherein n is a positive integer.

2. The error correction method of claim 1, wherein
   when the 0th codeword, which is the first codeword of the codeword sequence, is taken as the operation start data, the product-sum operation is repeatedly performed using n pieces of codewords from the 0th codeword to the (n−1)-th codeword to obtain the syndrome polynomial of the codeword sequence.

3. The error correction method of claim 1, wherein
   when the 0th codeword, which is the first codeword in the codeword sequence, is taken as the operation start data, said repeating, a product-sum operation and said multiplying the first partial syndrome polynomial are executed to obtain the syndrome polynomial of the codeword sequence.

4. An apparatus for error correction comprising syndrome operation means for repeating a cycle in which a syndrome operation is started taking an s-th codeword in a codeword sequence i of a codeword length n composed of 0th to (n−1)-th codewords as an operation start data, and when the syndrome operation for the s-th codeword is completed, a syndrome operation is performed for a polynomial which is obtained by adding a result of the syndrome operation and a next (s+1)-th codeword, n times, thereby obtaining a syndrome polynomial composed of n terms, wherein the syndrome operation means comprise:
addition means for adding a result of a syndrome operation of a p-th cycle and a codeword of a (p+1)-th cycle to obtain a polynomial composed of (p+1) terms;
first Galois field multiplication means for multiplying each term of the polynomial from said addition means by an element $\alpha^i \alpha^\gamma$ of a Galois field to obtain a syndrome polynomial of the (p+1)-th cycle;
operation result storage means for containing the syndrome polynomial of the (p+1)-th cycle from said first Galois field multiplication means as an operation interim result;
second Galois field multiplication means for multiplying the operation interim result from said the operation result storage means by index compensating coefficients, and outputting a partial syndrome; and
index compensated output selecting means for selecting one of the operation interim result from said operation result storage means and the partial syndrome from said second Galois field multiplication means, and outputting selected one to said addition means as a result of a syndrome operation in the (p+1)-th cycle,
wherein said index compensated output selecting means is operable to select the partial syndrome from said second Galois field multiplication means in a (n−s)-th cycle in which a syndrome operation of a last codeword in the codeword sequence is performed,
wherein $1 \leq s \leq n-1$,
wherein i is an integer that is 0 or more,
wherein n is a positive integer, and
wherein $1 \leq p \leq n-1$.

5. The error correction apparatus of claim 4, wherein a plurality of said syndrome operation means are included, and codewords of plural codeword sequences are respectively input to the syndrome operation means for corresponding codeword sequences, to perform parallel syndrome polynomial operations for the plural codeword sequences.

6. The error correction apparatus of claim 5, further comprising:
counter means for generating an index compensation cycle signal of a codeword sequence which is subjected to index compensation first among the plural codeword sequences; and
delay means for generating h pieces of delay signals corresponding to the number h of the plural syndrome operation means, the delay signals being delayed with respect to the index compensation cycle signal successively by k cycles based on the index compensation cycle signal,
wherein said delay means is operable to output the delay signals to said index compensated output selecting means included in each of said syndrome operation means as selection signals, respectively, thereby executing the index compensation for the operation interim result in each of said syndrome operation means with a delay of k cycles each, and
wherein h and k are positive integers.

7. The error correction apparatus of claim 4, further comprising:
counter means for generating an index compensation cycle signal of a codeword sequence which is subjected to index compensation first among the plural codeword sequences; and
delay means for generating h pieces of delay signals corresponding to the number h of the plural syndrome operation means, the delay signals being delayed with respect to the index compensation cycle signal successively by k cycles based on the index compensation cycle signal,
wherein said delay means is operable to output the delay signals to said index compensated output selecting means included in each of said syndrome operation means as selection signals, respectively, thereby executing the index compensation for the operation interim result in each of said syndrome operation means with a delay of k cycles each, and
wherein h and k are positive integers.

* * * * *